United States Patent
Bang et al.

(10) Patent No.: US 10,426,041 B2
(45) Date of Patent: Sep. 24, 2019

(54) METHOD OF MANUFACTURING PRINTED-CIRCUIT BOARD ASSEMBLY

(71) Applicant: Samsung Electronics Co., Ltd., Gyeonggi-do (KR)

(72) Inventors: Jung-Je Bang, Gyeonggi-do (KR); Mi-Jin Kim, Gyeonggi-do (KR); Sae-Bom Lee, Gyeonggi-do (KR); Hyun-Joo Han, Gyeonggi-do (KR); Kun-Tak Kim, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 565 days.

(21) Appl. No.: 14/920,513

(22) Filed: Oct. 22, 2015

(65) Prior Publication Data

US 2016/0120039 A1 Apr. 28, 2016

(30) Foreign Application Priority Data

Oct. 23, 2014 (KR) ........................ 10-2014-0144242

(51) Int. Cl.
*H05K 3/32* (2006.01)
*H01L 23/552* (2006.01)
(Continued)

(52) U.S. Cl.
CPC ............. *H05K 3/321* (2013.01); *H01L 23/36* (2013.01); *H01L 23/552* (2013.01); *H01L 24/29* (2013.01);
(Continued)

(58) Field of Classification Search
CPC .......... B05D 5/12; H05K 3/321; H05K 3/341; H05K 1/0203; H05K 1/0216; H05K 1/023; H05K 3/3494; H05K 2201/066; H05K 2201/10371; H05K 2201/1056; H01L 21/563; H01L 23/10; H01L 23/36;
(Continued)

(56) References Cited

U.S. PATENT DOCUMENTS 4,606,962 A * 8/1986 Reylek ........................ C09J 7/00
156/250
4,842,911 A * 6/1989 Fick .................... H01L 23/3737
174/16.3

(Continued)

FOREIGN PATENT DOCUMENTS

CN 1577815 2/2005
EP 0 688 649 12/1995
(Continued)

OTHER PUBLICATIONS

European Search Report dated Mar. 18, 2016 issued in counterpart application No. 15190913.2-1806, 7 pages.
(Continued)

*Primary Examiner* — Carl J Arbes
(74) *Attorney, Agent, or Firm* — The Farrell Law Firm, P.C.

(57) ABSTRACT

A method is provided for manufacturing a printed circuit board assembly. A method includes applying a liquefied radiant-heat material on a heating component mounted on the printed circuit board; mounting a shield unit on the printed circuit board in contact with the liquefied radiant-heat material; and simultaneously curing the liquefied radiant-heat material and bonding the shield unit.

15 Claims, 25 Drawing Sheets

(51) Int. Cl.
| | |
|---|---|
| *H01L 23/00* | (2006.01) |
| *H05K 1/02* | (2006.01) |
| *H05K 3/34* | (2006.01) |
| *H01L 23/36* | (2006.01) |
| *H01L 23/10* | (2006.01) |
| *H01L 21/56* | (2006.01) |
| *H01L 23/373* | (2006.01) |
| *H01L 23/42* | (2006.01) |
| *H01L 23/427* | (2006.01) |

(52) U.S. Cl.
CPC ......... *H01L 24/92* (2013.01); *H05K 1/0203* (2013.01); *H05K 3/341* (2013.01); *H01L 21/563* (2013.01); *H01L 23/10* (2013.01); *H01L 23/3737* (2013.01); *H01L 23/42* (2013.01); *H01L 23/4275* (2013.01); *H01L 24/16* (2013.01); *H01L 24/32* (2013.01); *H01L 24/73* (2013.01); *H01L 24/81* (2013.01); *H01L 24/83* (2013.01); *H01L 2224/16225* (2013.01); *H01L 2224/16227* (2013.01); *H01L 2224/16238* (2013.01); *H01L 2224/29194* (2013.01); *H01L 2224/32225* (2013.01); *H01L 2224/32245* (2013.01); *H01L 2224/73203* (2013.01); *H01L 2224/73204* (2013.01); *H01L 2224/73253* (2013.01); *H01L 2224/81191* (2013.01); *H01L 2224/81193* (2013.01); *H01L 2224/81815* (2013.01); *H01L 2224/83191* (2013.01); *H01L 2224/83855* (2013.01); *H01L 2224/9221* (2013.01); *H01L 2224/92125* (2013.01); *H01L 2224/92225* (2013.01); *H01L 2924/1421* (2013.01); *H01L 2924/16152* (2013.01); *H01L 2924/16235* (2013.01); *H01L 2924/16251* (2013.01); *H01L 2924/19105* (2013.01); *H01L 2924/3025* (2013.01); *H05K 1/023* (2013.01); *H05K 1/0216* (2013.01); *H05K 3/3494* (2013.01); *H05K 2201/066* (2013.01); *H05K 2201/1056* (2013.01); *H05K 2201/10371* (2013.01); *Y02P 70/613* (2015.11)

(58) Field of Classification Search
CPC ... H01L 23/42; H01L 23/552; H01L 23/3737; H01L 2224/16225; H01L 2224/16227; H01L 2224/16238; H01L 2224/29194; H01L 2224/32225; H01L 2224/32245; H01L 2224/73203; H01L 2224/73204; H01L 2224/73253; H01L 2224/81191; H01L 2224/81193; H01L 2224/81815; H01L 2224/83191; H01L 2224/83855; H01L 2224/92125; H01L 2224/9221; H01L 2224/92225; H01L 2924/1421; H01L 2924/16235; H01L 2924/16251; H01L 2924/19105; H01L 2924/3025; H05L 23/4275; H05L 24/16; H05L 24/29; H05L 24/32; H05L 24/73; H05L 24/81; H05L 24/83; H05L 24/92; Y02P 70/613
See application file for complete search history.

(56) References Cited

U.S. PATENT DOCUMENTS

| | | | | |
|---|---|---|---|---|
| 4,869,954 A * | 9/1989 | Squitieri | ............... | B32B 27/40 427/393.5 |
| 5,194,480 A * | 3/1993 | Block | ............... | C08K 3/22 524/404 |
| 5,467,251 A * | 11/1995 | Katchmar | ............... | H01L 23/3672 174/252 |
| 5,605,809 A * | 2/1997 | Komoriya | ............... | C07K 7/06 435/18 |
| 5,781,412 A * | 7/1998 | de Sorgo | ............... | H01L 23/42 257/702 |
| 6,458,628 B1 * | 10/2002 | Distefano | ............... | H01L 21/565 257/E21.504 |
| 6,998,532 B2 * | 2/2006 | Kawamoto | ............... | H01L 24/16 174/521 |
| 7,268,428 B2 * | 9/2007 | Edwards | ............... | H01L 23/04 257/712 |
| 8,119,191 B2 * | 2/2012 | Bunyan | ............... | C08K 7/16 427/284 |
| 8,434,220 B2 * | 5/2013 | Rao | ............... | H01L 23/552 29/831 |
| 8,923,008 B2 * | 12/2014 | Yoshikawa | ............... | H05K 1/188 174/257 |
| 9,693,481 B2 * | 6/2017 | Timmerman | ............... | H01L 24/29 |
| 2002/0022136 A1 * | 2/2002 | Valade | ............... | C08L 83/04 428/447 |
| 2003/0002271 A1 * | 1/2003 | Nurminen | ............... | H01L 23/3128 361/818 |
| 2003/0113531 A1 * | 6/2003 | Hajmrle | ............... | C08K 3/08 428/327 |
| 2004/0238934 A1 * | 12/2004 | Warner | ............... | H01L 23/24 257/686 |
| 2004/0262746 A1 | 12/2004 | Jung | | |
| 2006/0151203 A1 * | 7/2006 | Krueger | ............... | H03H 9/0557 174/260 |
| 2007/0045819 A1 | 3/2007 | Edwards et al. | | |
| 2009/0079041 A1 * | 3/2009 | Huang | ............... | H01L 21/561 257/660 |
| 2010/0157544 A1 | 6/2010 | Tsao et al. | | |
| 2011/0154661 A1 | 6/2011 | Park et al. | | |
| 2012/0074538 A1 * | 3/2012 | Tsai | ............... | H01L 23/3121 257/659 |
| 2012/0228012 A1 * | 9/2012 | Yoshikawa | ............... | H05K 1/188 174/257 |
| 2015/0163958 A1 | 6/2015 | Oguma et al. | | |

FOREIGN PATENT DOCUMENTS

| | | |
|---|---|---|
| EP | 1 347 513 | 9/2003 |
| EP | 1 493 314 | 1/2005 |
| JP | 2004-069299 | 3/2004 |
| KR | 10-2011-0077042 | 7/2011 |
| KR | 10-2014-0132880 | 11/2014 |
| WO | WO 03/088729 | 10/2003 |
| WO | WO 2013/187298 | 12/2013 |

OTHER PUBLICATIONS

Chinese Office Action dated Dec. 5, 2018 issued in counterpart application No. 201510698102.X, 21 pages.
Chinese Office Action dated Aug. 2, 2019 issued in counterpart application No. 201510698102.X, 19 pages.

* cited by examiner

METHOD OF MANUFACTURING PRINTED-CIRCUIT BOARD ASSEMBLY

PRIORITY

This application claims priority under 35 U.S.C. § 119(a) to Korean Application Serial No. 10-2014-0144242, which was filed in the Korean Intellectual Property Office on Oct. 23, 2014, the entire disclosure of which is incorporated herein by reference.

BACKGROUND

1. Field of the Invention

The present disclosure relates generally to the manufacturing of a printed circuit board assembly, and more particularly, to a method that mounts an electronic component on a printed circuit board of an electronic device.

2. Description of the Related Art

When electronic devices operate, electronic components in the electronic devices emit electromagnetic waves. Since the emitted electromagnetic waves may create noise in the communication functions of the electronic devices, shield parts, i.e., shield unit mounting structures, for blocking the electromagnetic waves are often provided on upper surfaces of the electronic components, when the electronic components are mounted on substrates, such a printed circuit boards (PCBs).

The four general shield unit mounting structures include a mechanical shielding type, a clip type, a frame type, and a cover type.

In the mechanical shielding type, a shield unit is fastened to a substrate with screws, and a separate wall is welded to reinforce the surroundings of an important integrated circuit (IC) component. While the mechanical shielding type is easy to repair, it requires an additional process for screw fastening and has the weakest reliability, compared to other types of shield unit mounting structures.

The clip type includes a cover for shielding a component and clips for securing the cover to a substrate. Generally, the clips are mounted and bonded to the substrate along the periphery of the cover, and then the cover is fastened to the clips. The clip type is advantageous in terms of repair, space, and cost, but still requires a manual process for cover fastening and has a lower reliability than the frame type. Further, the cover is often separated from the clips.

The frame type includes a cover for shielding a component and a frame to which the cover is coupled. Because a single frame is used, the frame type has fewer components than the clip type, which uses a plurality of clips. In addition, because the area where the frame type structure is fixed to a substrate is larger than the clip type, the frame type has better reliability. However, due to the pick-up space and the width of the frame, the frame type has limitations in an under-fill applying process for a component bonded to the lower side of the frame and in a working space for repairing the component, and has a drawback that the height of the component increases.

The cover type includes only a cover, rather than a clip or a frame, and the cover itself is bonded to a substrate, similar to the mechanical shielding type. The cover type is advantageous in that the number of components is reduced to one and the total height of the component is low. However, after a shield unit is mounted, an under-fill resin cannot be applied to an IC component below the shield unit, and thus, the cover type cannot be applied to the mounting portion of a component requiring under-fill.

Components for performing various kinds of functions may be located below the various mounting forms of shield units described above. However, active elements consuming a large amount of power, such as an application processor (AP), a power amplifier module (PAM), a power management integrated circuit (PMIC), etc., generate a great deal of heat while operating. In order to prevent performance degradation due to this heat, a radiant-heat material, referred to as "thermal interface material (TIM)", may be interposed between a heating component and a metal shield unit to rapidly transfer the heat generated from the component to the metal shield unit. In this case, a solid material in the form of a pad or sheet may be used as the TIM.

To mount the frame type of shield unit mounting structure, solder is printed on a substrate, an electronic component is then mounted, reflow soldering is added, an under-fill resin is applied, the under-fill resin is cured, and a shield unit cover to which a radiant-heat pad (e.g., a TIM pad) is attached is fastened.

Recently, a post-fastening process for a shield unit cover has been removed, and a shield unit frame and a cover that are integrally fastened to each other have often been mounted in order to enhance productivity.

However, because a radiant-heat material has to be brought close to a component and in order for the shield unit to achieve stable heat-transfer effect when the radiant-heat material is disposed below the shield unit, only the shield unit frame is mounted in the component mounting step, and thereafter, a shield unit cover to which a radiant-heat material is attached is manually fastened by applying pressure to a certain degree in the final process step.

Such a technology has a limitation in productivity enhancement, however, because the shield unit cover is manually fastened in the process. This is problematic in terms of product reliability because the compressive stress of the radiant-heat material between the component and the shield unit is transmitted to the whole substrate.

SUMMARY

Accordingly, an aspect of the present disclosure is to increase the degree of freedom of a substrate manufacturing process and remove manual operations.

Another aspect of the present disclosure is to provide a method of manufacturing a printed circuit board assembly that can implement, altogether, a process of filling a space between a package and a shield unit with a heat dissipation material, in order to bond the shield unit and rapidly transfer the heat generated from the package to the shield unit to diffuse the heat, thereby solving problems relating to electromagnetic wave shielding and heat dissipation of a substrate.

Another aspect of the present disclosure is to provide a method of manufacturing a printed circuit board assembly that can replace a conventional solid heat-dissipation material with a liquid heat-dissipation material having a higher degree of freedom of a shape and an excellent adhesion force at an interface, thereby performing, altogether, heat dissipation material filling during the process of mounting a component and a shield unit.

Another aspect of the present disclosure is to provide a method of manufacturing a printed circuit board assembly without manually fastening a shield unit cover to which a heat dissipation material is applied, in order to resolve compressive stress caused by heat dissipation material filling, and to make an electronic device slimmer by decreasing the gap between a component and a shield unit.

In accordance with an aspect of the present disclosure, a method is provided for manufacturing a printed circuit board assembly, which includes applying a liquefied radiant-heat material on a heating component mounted on the printed circuit board; mounting a shield unit on the printed circuit board in contact with the liquefied radiant-heat material; and simultaneously curing the liquefied radiant-heat material and bonding the shield unit.

In accordance with another aspect of the present disclosure, a method is provided for manufacturing a printed circuit board assembly, which includes applying solder to a plurality of bonding pads provided on the printed circuit board; mounting an electronic component on the applied solder; applying a liquefied radiant-heat material on the electronic component; mounting a shield unit on at least one of the bonding pads, the shield unit contacting the liquefied radiant-heat material; and simultaneously bonding the electronic component and the shield unit and curing the liquefied radiant-heat material.

In accordance with another aspect of the present disclosure, a method is provided for manufacturing a printed circuit board assembly, which includes applying solder, at a first temperature, to a plurality of bonding pads provided on the printed circuit board; mounting an electronic component on the applied solder; bonding the electronic component to the printed circuit board through heating; applying an underfill resin material for reinforcing a strength of the electronic component; applying a liquefied radiant-heat material on the electronic component; mounting a shield unit on the shield unit bonding pad, the shield unit contacting the liquefied radiant-heat material; and simultaneously curing the underfill resin material and the liquefied radiant-heat material and bonding the shield unit through heating.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Figure 1:
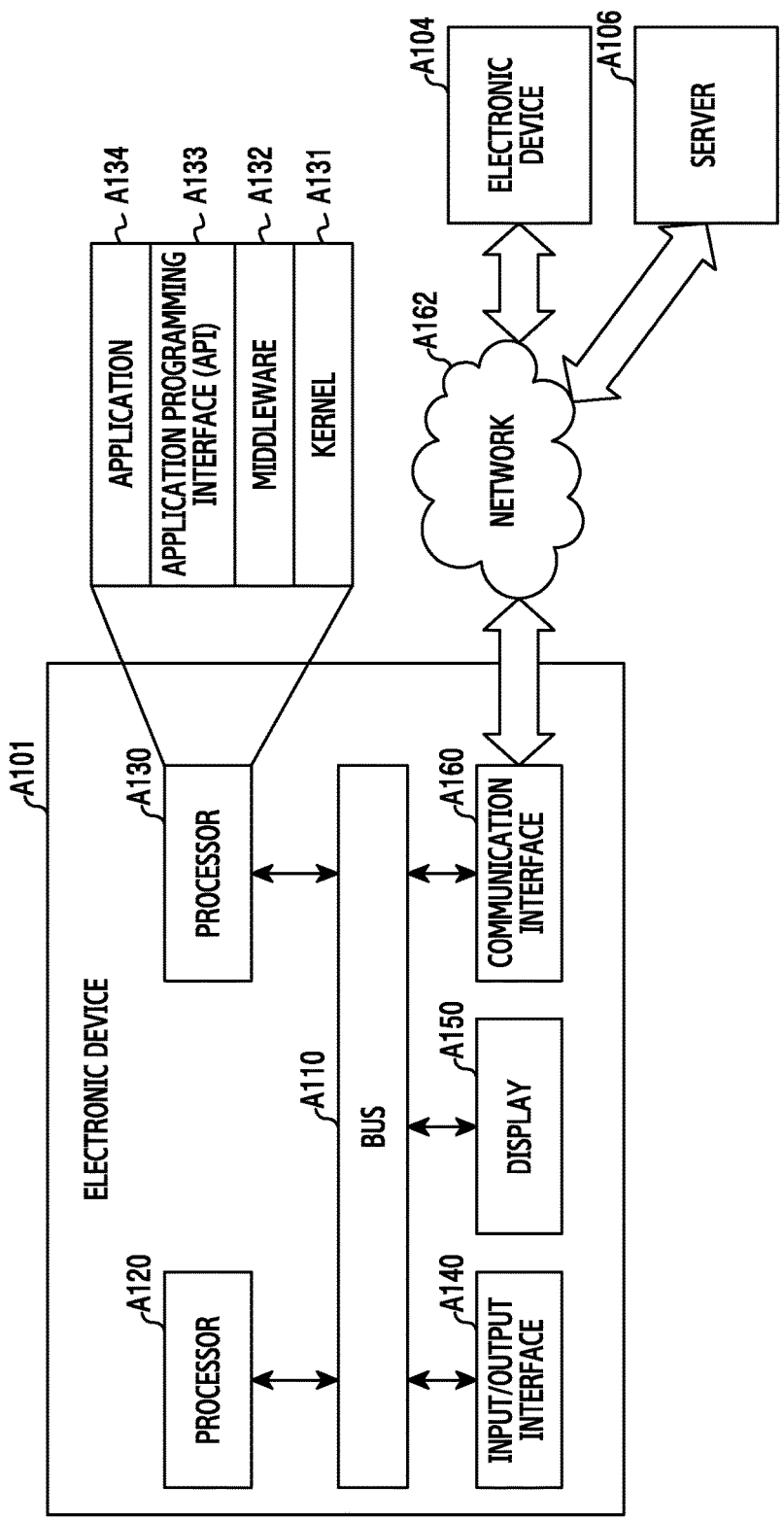
FIG. 1 illustrates an electronic device in a network environment according to an embodiment of the present disclosure.

Various embodiments of the present disclosure will now be described in detail with reference to the accompanying drawings. In the following description, specific details such as detailed configurations and components are merely provided to assist the overall understanding of these embodiments of the present disclosure. Therefore, it should be apparent to those skilled in the art that various changes and modifications of the embodiments described herein can be made without departing from the scope and spirit of the present disclosure. In addition, descriptions of well-known functions and constructions are omitted for clarity and conciseness.

Herein, the terms "include", "have", or "may include" indicate the presence of functions, features, numbers, steps, operations, elements, parts, etc., but do not preclude the presence or addition of other functions, features, numbers, steps, operations, elements, parts, etc.

Herein, the terms "or", "at least one of", and "and/or" include any and all combinations of words enumerated with it. For example, "A or B" means A, B, or both A and B.

Although the terms such as "first" and "second" may be used herein to modify various elements, these terms do not limit the corresponding elements. For example, these terms do not limit an order and/or importance of the corresponding elements, but may be used to distinguish one element from another element. For example, a first user device and a second user device may indicate different user devices. For example, a first element may be referred to as a second element, and similarly, a second element may be referred to as a first element.

When an element is described as being "connected" or "coupled" to another element, the element may be directly connected or coupled to the another element, or there may be an intervening element between the element and the another element. However, when an element is described as being "directly connected" or "directly coupled" to another element, there is no intervening element between the element and the another element.

Additionally, singular forms are intended to include plural forms as well, unless the context clearly indicates otherwise.

All of the terms used herein including technical or scientific terms have meanings as those generally understood by an ordinary skilled person in the related art unless otherwise defined. The terms defined in a generally used dictionary should be interpreted as having the same meanings as the contextual definitions of the relevant technology and should not be interpreted as having ideal or exaggerated meanings unless clearly defined as such.

Herein, the term "user" may refer to a person who uses the electronic device or a device that uses the electronic device (for example, an artificial intelligence electronic device).

Examples of an electronic device in which a printed circuit board according to an embodiment of the present disclosure may incorporated include a smartphone, a tablet personal computer (PC), a mobile phone, a video phone, an electronic book reader, a desktop PC, a laptop PC, a netbook computer, a Personal Digital Assistant (PDA), a Portable Multimedia Player (PMP), an MP3 player, a mobile medical machine, a camera, or a wearable device (e.g., a head-mounted-device (HMD) such as electronic glasses, electronic clothing, an electronic bracelet, an electronic necklace, an electronic appcessory, electronic tattoos, or a smartwatch).

The electronic device may also be a smart home appliance that is equipped with a communication function, such as a television, a Digital Video Disk (DVD) player, a stereo, a refrigerator, an air conditioner, a cleaner, an oven, a microwave oven, a washing machine, an air cleaner, a set-top box, a TV box (for example, Samsung HomeSync®, Apple TV®, or Goggle TV®), a game console, an electronic dictionary, an electronic key, a camcorder, or an electronic album.

The electronic device may also include various medical machines (for example, a Magnetic Resonance Angiography (MRA) device, a Magnetic Resonance Imaging (MRI) device, a Computerized Tomography (CT) device, a tomograph, an ultrasound machine, etc.), a navigation device, a Global Positioning System (GPS) receiver, an Event Data Recorder (EDR), a Flight Data Recorder (FDR), an automotive infotainment device, electronic equipment for ship (for example, a navigation equipment for ship, a gyro compass, etc.), avionics, a security device, or an industrial or home robot.

The electronic device may also include furniture or a building/a structure including a communication function, an electronic board, an electronic signature receiving device, a projector, and various measurement devices (for example, water, power, gas, radio waves, etc.).

The electronic device may also be a combination of one or more of the above-mentioned devices.

In addition, the electronic device is not limited to the above-described example devices.

FIG. 1 illustrates a network environment including an electronic device according to an embodiment of the present disclosure.

Referring to FIG. 1, the electronic device A101 includes a bus A110, a processor A120, a memory A130, an input/output interface A140, a display A150, and a communication interface A160.

The bus A110 connects the above-described elements with one another and transmits communication signals (for example, a control message) between the above-described elements.

The processor A120 may receive instructions from the other elements via the bus A110, decipher the instructions, and perform calculation or data processing according to the deciphered instructions.

The memory A130 may store instructions or data received from or generated by the processor A120 or the other elements. For example, the memory A130 includes programming modules, i.e., a kernel A131, middleware A132, an Application Programming Interface (API) A133, and an application A134. Each of the above-described programming modules may be configured by software, firmware, hardware, or a combination of two or more of them.

The kernel A131 may control or manage system resources (for example, the bus A110, the processor A120, the memory A130, etc.), which are used for performing operations or functions implemented in the other programming modules, for example, the middleware A132, the API A133, or the application A134. In addition, the kernel A131 may provide an interface for the middleware A132, the API A133, or the application A134 to access an individual element of the electronic device A101 and control or manage the element.

The middleware A132 may serve as an intermediary for the API A133 or the application A134 to communicate with the kernel A131 and exchange data with the kernel A131. In addition, the middleware A132 may perform controlling (for example, scheduling or load balancing) with respect to work requests received from the application A134, for example, by giving priority to use the system resources of the electronic device A101 (for example, the bus A110, the processor A120, the memory A130, etc.) to at least one of the applications A134.

The API A133 may allow the application A134 to control a function provided by the kernel A131 or the middleware A134, and for example, may include at least one interface or function for controlling a file, controlling a window, processing an image, and/or controlling a text.

The application A134 may include a Short Message Service (SMS)/Multimedia Messaging Service (MMS) application, an email application, a calendar application, a notification application, a health care application, an environment information application, etc. Additionally or alternatively, the application A134 may be related to information exchange between the electronic device A101 and an electronic device A104. For example, the application related to the information exchange may include a notification relay application for relaying specific information to the external electronic device or a device management application for managing the external electronic device.

For example, the notification relay application may relay notification information generated by other applications of the electronic device A101 to the electronic device A104.

Additionally or alternatively, the notification relay application may receive notification information from the electronic device A104 and provide the same to the user. For example, the device management application may manage (for example, install, delete, update, etc.) a function regarding at least part of the electronic device A104 communicating with the electronic device A101 (for example, turning on/off the electronic device A104 (or some parts thereof) or adjusting brightness of a display), an application operating in the external electronic device or a service provided by the electronic device A104 (e.g., a calling service or a message service).

The application A134 may include an application specified according to an attribute (for example, a kind of an electronic device) of the electronic device A104. For example, when the electronic device A104 is an MP3 player, the application A134 may include an application related to music replay. Similarly, when the electronic device A104 is a mobile medical device, the application A134 may include an application related to health care.

The application A134 may include at least one of an application specified by the electronic device A101 or an application received from an external electronic device (for example, a server A106, or the electronic device A104).

The input/output interface A140 may transmit instructions or data input by a user through a sensor (for example, an acceleration sensor or a gyro sensor) or an input device (for example, a keyboard or a touch screen) to the processor A120, the memory A130, or the communication interface A160 through the bus A110. For example, the input and output interface A140 may provide data on a user's touch input through a touch screen to the processor A120.

In addition, the input/output interface A140 may output instructions or data received from the processor A120, the memory A130, the communication interface A160, or the sensor module A170, through the bus A110, through an output device (for example, a speaker or a display). For example, the input and output interface A140 may output voice data processed through the processor A120 to the user through a speaker.

The display A150 may display a variety of information (for example, multimedia data, text data, and the like) for the user.

The communication interface A160 may connect communication between the electronic device 101A and the electronic device 104 or the server A106. For example, the communication interface 160 may support communication through a network A162 (for example, the Internet, a Local Area Network (LAN), A Wire Area Network (WAN), a telecommunication network, a cellular network, a satellite network, a Plain Old Telephone Service (POTS), etc.), and short-distance communication (for example, Wireless Fidelity (WiFi), Bluetooth (BT), Near Field Communication (NFC), or wired communication (for example, a Universal Serial Bus (USB), a High Definition Multimedia Interface (HDMI), a Recommended Standard 232 (RS-232), or POTS)).

A protocol for communicating between the electronic device A101 and the electronic device 104 (for example, a short-distance communication protocol, a network communication protocol, or a wired communication protocol) may be supported in at least one of the API A133 or the middleware A132. The electronic device A104 may be the same type of device as the electronic device A101 or a different type of device.

Figure 2:
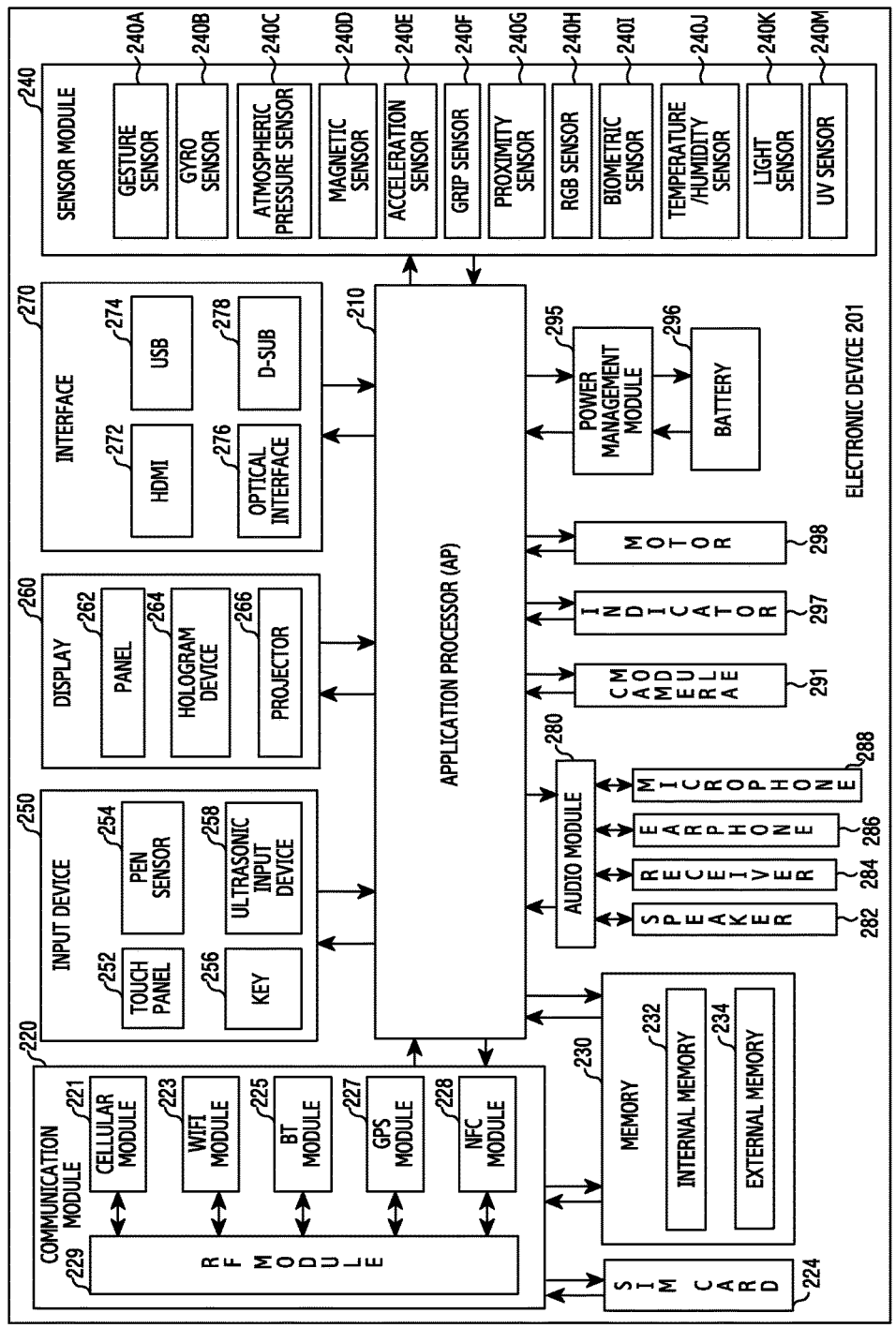
FIG. 2 illustrates an electronic device according to an embodiment of the present disclosure.

FIG. 2 illustrates an electronic device according to an embodiment of the present disclosure.

Referring to FIG. 2, the electronic device 201 includes an AP 210, a communication module 220, a Subscriber Identification Module (SIM) card 224, a memory 230, a sensor module 240, an input device 250, a display 260, an interface 270, an audio module 280, a camera module 291, a power management module 295, a battery 296, an indicator 297, and a motor 298.

The AP 210 may control a plurality of hardware or software elements connected to the AP 210 by driving an operating system (OS) or an application program, and may process and calculate a variety of data including multimedia data. For example, the AP 210 may be implemented by using a System on Chip (SoC). The AP 210 may further include a Graphic Processing Unit (GPU).

The communication module 220 may transmit and receive data via communication between the electronic device 201 and other electronic devices connected through a network. The communication module 220 includes a cellular module 221, a WiFi module 223, a BT module 225, a GPS module 227, an NFC module 228, and a Radio Frequency (RF) module 229.

The cellular module 221 may provide a voice call, a video call, a text service, or an internet service through a telecommunications network (for example, LTE, LTE-A, CDMA, WCDMA, UMTS, WiBro, GSM, etc.). In addition, the cellular module 221 may identify and authenticate the electronic device in the telecommunications network by using a subscriber identification module (for example, the SIM card 224). The cellular module 221 may perform at least some of the functions provided by the AP 210. For example, the cellular module 221 may perform at least some of the multimedia control functions.

The cellular module 221 may include a Communication Processor (CP). In addition, the cellular module 221 may be implemented by using a SoC. In FIG. 2, the cellular module 221, the memory 230, or the power management module 295 are elements separate from the AP 210; however, the AP 210 may be configured to include at least some of the above-described elements.

The AP 210 or the cellular module 221 may load instructions or data received from a non-volatile memory connected therewith or at least one of the other elements into a volatile memory, and may process the instructions or data. In addition, the AP 210 or the cellular module 221 may store data which is received from at least one of the other elements or generated by at least one of the other elements in the non-volatile memory.

The WiFi module 223, the BT module 225, the GPS module 227, or the NFC module 228 each may include a processor for processing data received and transmitted through a corresponding module. Although the cellular module 221, the WiFi module 223, the BT module 225, the GPS module 227, and the NFC module 228 are illustrated in separate blocks, at least some of these modules may be included in a single integrated chip (IC) or a single IC package.

The RF module 229 may transmit and receive an RF signal. The RF module 229 may include a transceiver, a PAM, a frequency filter, or a Low Noise Amplifier (LNA). In addition, the RF module 229 may further include a part for exchanging electromagnetic waves in a free space in wireless communication, for example, a conductor or conducting wire.

Although the cellular module 221, the WiFi module 223, the BT module 225, the GPS module 227, and the NFC module 228 share the RF module 229 with one another, alternatively, at least one of the cellular module 221, the WiFi module 223, the BT module 225, the GPS module 227, and the NFC module 228 may transmit and receive an RF signal through a separate RF module.

The SIM card 224 may be inserted into a slot formed on a specific location of the electronic device. The SIM card 224 may include unique identification information (for example, an Integrated Circuit Card Identifier (ICCID)) or subscriber information (for example, International Mobile Subscriber Identity (IMSI)).

The memory 230 includes an internal memory 232 and an external memory 234. For example, the internal memory 232 may include at least one of a volatile memory (for example, a Dynamic Random Access Memory (DRAM), a Static Random Access Memory (SRAM), a Synchronous DRAM (SDRAM), etc.) and a non-volatile memory (for example, an One-Time Programmable Read Only Memory (OTPROM), a Programmable Read Only Memory (PROM), an Erasable Programmable Read Only Memory (EPROM), an Electrically Erasable Programmable Read Only Memory (EEPROM), a mask ROM, a flash ROM, a NAND flash memory, a NOR flash memory, and the like).

The internal memory 232 may be a Solid State Drive (SSD).

The external memory 234 may further include a flash drive, for example, Compact Flash (CF), Secure Digital (SD), Micro-SD, Mini-SD, extreme-Digital (xD), a memory stick, and the like. The external memory 234 may be functionally connected with the electronic device 201 through various interfaces. The electronic device 201 may further include a storage device (or a storage medium) such as a hard drive.

The sensor module 240 may measure a physical quantity or detect an operation state of the electronic device 201, and may convert measured or detected information into electric signals. The sensor module 240 includes a gesture sensor 240A, a gyro sensor 240B, a barometric pressure sensor 240C, a magnetic sensor 240D, an acceleration sensor 240E, a grip sensor 240F, a proximity sensor 240G, a color sensor 240H (e.g., Red, Green, Blue (RGB) sensor), a biosensor 240I, a temperature/humidity sensor 240J, an illumination sensor 240K, and a Ultraviolet (UV) sensor 240M.

Additionally or alternatively, the sensor module 240 may include an E-nose sensor, an electromyography (EMG) sensor, an electroencephalogram (EEG) sensor, an electrocardiogram (ECG) sensor, an infrared ray (IR) sensor, an iris sensor, a fingerprint sensor, etc. The sensor module 240 may further include a control circuit to control at least one sensor included therein.

The input device 250 includes a touch panel 252, a (digital) pen sensor 254, a key 256, and an ultrasonic input device 258. The touch panel 252 may recognize a touch input in at least one method of capacitive, resistive, infrared, and ultrasonic methods. In addition, the touch panel 252 may further include a control circuit (not shown). The touch panel 252 may recognize physical contact or hovering. The touch panel 252 may further include a tactile layer. In this embodiment, the touch panel 252 may provide a tactile response to the user.

The (digital) pen sensor 254 may be implemented in the same or similar method as or to the method of receiving a user's touch input or by using a separate detection sheet. The key 256 may include a physical button, an optical key, or a keypad.

The ultrasonic input device 258 allows the electronic device 201 to detect sound waves through the microphone 288 through an input tool generating ultrasonic signals and identify data, and is capable of wireless recognition. The electronic device 201 may receive a user input from an external device connected thereto (for example, a computer or a server) by using the communication module 220.

The display 260 includes a panel 262, a hologram device 264, and a projector 266. For example, the panel 262 may be a Liquid Crystal Display (LCD) or an Active Matrix Organic Light Emitting Diode (AM-OLED). The panel 262 may be implemented to be flexible, transparent, or wearable. The panel 262 may be configured as a single module along with the touch panel 252.

The hologram device 264 may show a stereoscopic image in the air using interference of light.

The projector 266 may display an image by projecting light onto a screen. The screen may be located inside or outside the electronic device 201. The display 260 may further include a control circuit to control the panel 262, the hologram device 264, or the projector 266.

The interface 270 includes a High Definition Multimedia Interface (HDMI) 272, a Universal Serial Bus (USB) 274, an optical interface 276, and D-subminiature (sub) 278. Additionally or alternatively, the interface 270 may include a Mobile High Definition Link (MHL) interface, a Secure Digital (SD)/Multimedia Card (MMC) interface, and/or Infrared Data Association (IrDA) standard interface.

The audio module 280 may convert a sound and an electric signal bidirectionally. The audio module 280 may process sound information which is input or output through a speaker 282, a receiver 284, an earphone 286, and/or the microphone 288.

The camera module 291 photographs still and moving images. The camera module 291 may include one or more image sensors (for example, a front surface sensor or a rear surface sensor), a lens, an Image Signal Processor (ISP), or a flash (for example, a Light Emitting Diode (LED) or a xenon lamp).

The power management module 295 may manage power of the electronic device 201. The power management module 295 may include a PMIC, a charger IC, or a battery gauge.

For example, the PMIC may be mounted in an integrated circuit or a SoC semiconductor.

The charging method may be divided into a wire charging method and a wireless charging method. The charger IC may charge a battery and may prevent inflow of overvoltage or over current from a charger. The charger IC may include a charger IC for at least one of the wire charging method and the wireless charging method. The wireless charging method may include a magnetic resonance method, a magnetic induction method, or an electromagnetic wave method, and an additional circuit for charging wirelessly, for example, a circuit such as a coil loop, a resonant circuit, a rectifier, etc., may be added.

For example, the battery gauge may measure a remaining battery life of the battery 296, a voltage, a current, or temperature during charging. The battery 296 may store or generate electricity and may supply power to the electronic device 201 by using stored or generated electricity. The battery 296 may include a rechargeable battery or a solar battery.

The indicator 297 may display a specific state of the electronic device 201 or a part of it (for example, the AP 210), for example, a booting state, a message state, or a charging state.

The motor 298 may convert an electric signal into a mechanical vibration.

The electronic device 201 may include a processing device (for example, a GPU) for supporting a mobile TV. The processing device for supporting the mobile TV may process media data according to standards such as Digital Multimedia Broadcasting (DMB), Digital Video Broadcasting (DVB), or media flow.

Each of the above-described elements of the electronic device according to various exemplary embodiments of the present disclosure may be comprised of one or more components, and the names of the elements may vary according to the kind of the electronic device.

An electronic device according to an embodiment of the present disclosure may include at least one of the above-described elements, and some of the elements may be omitted or an additional element may be further included.

In addition, some of the elements of the electronic device illustrated in FIG. 2 may be combined into a single entity, and may perform the same functions as those of the elements before being combined.

Figure 3:
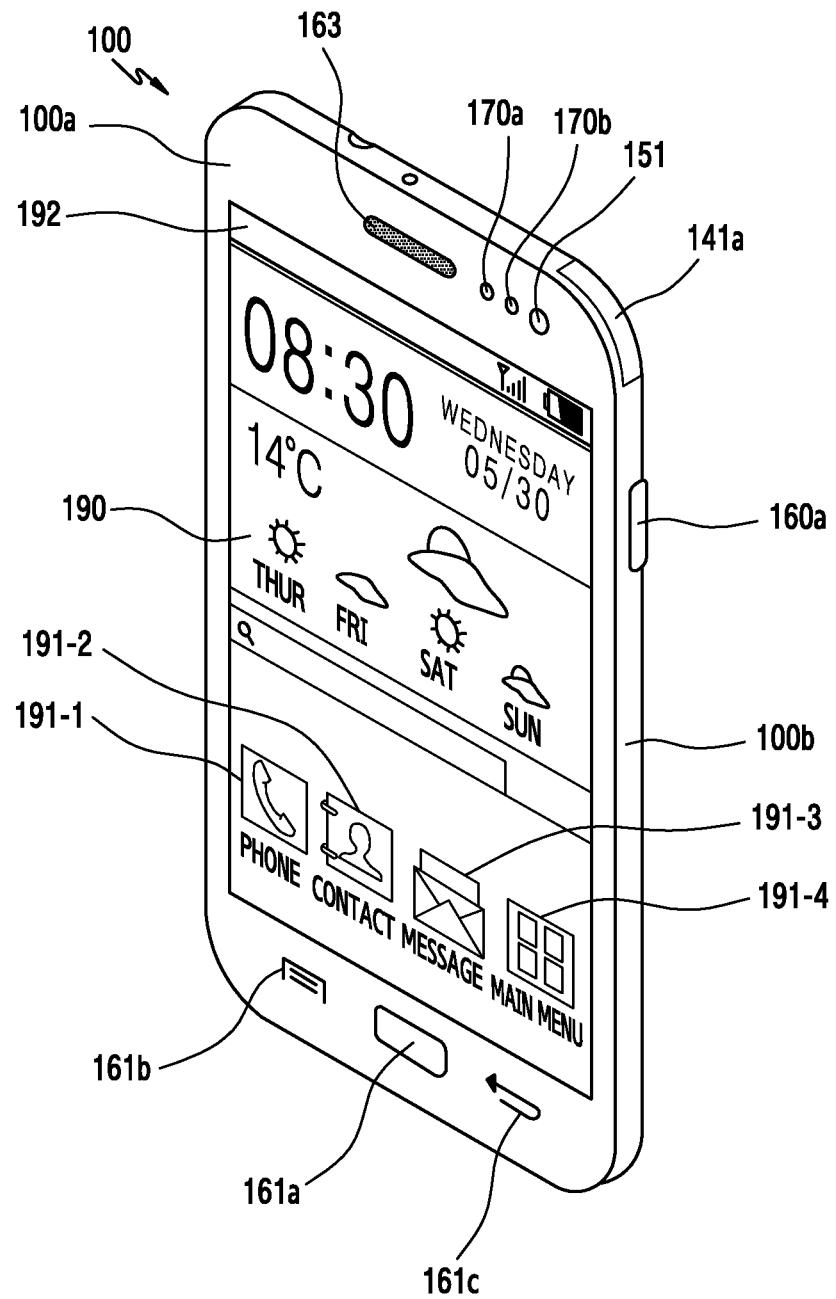
FIG. 3 illustrates a front side of an electronic device, according to an embodiment of the present disclosure.

FIG. 3 illustrates a front side of an electronic device, according to an embodiment of the present disclosure.

Figure 4:
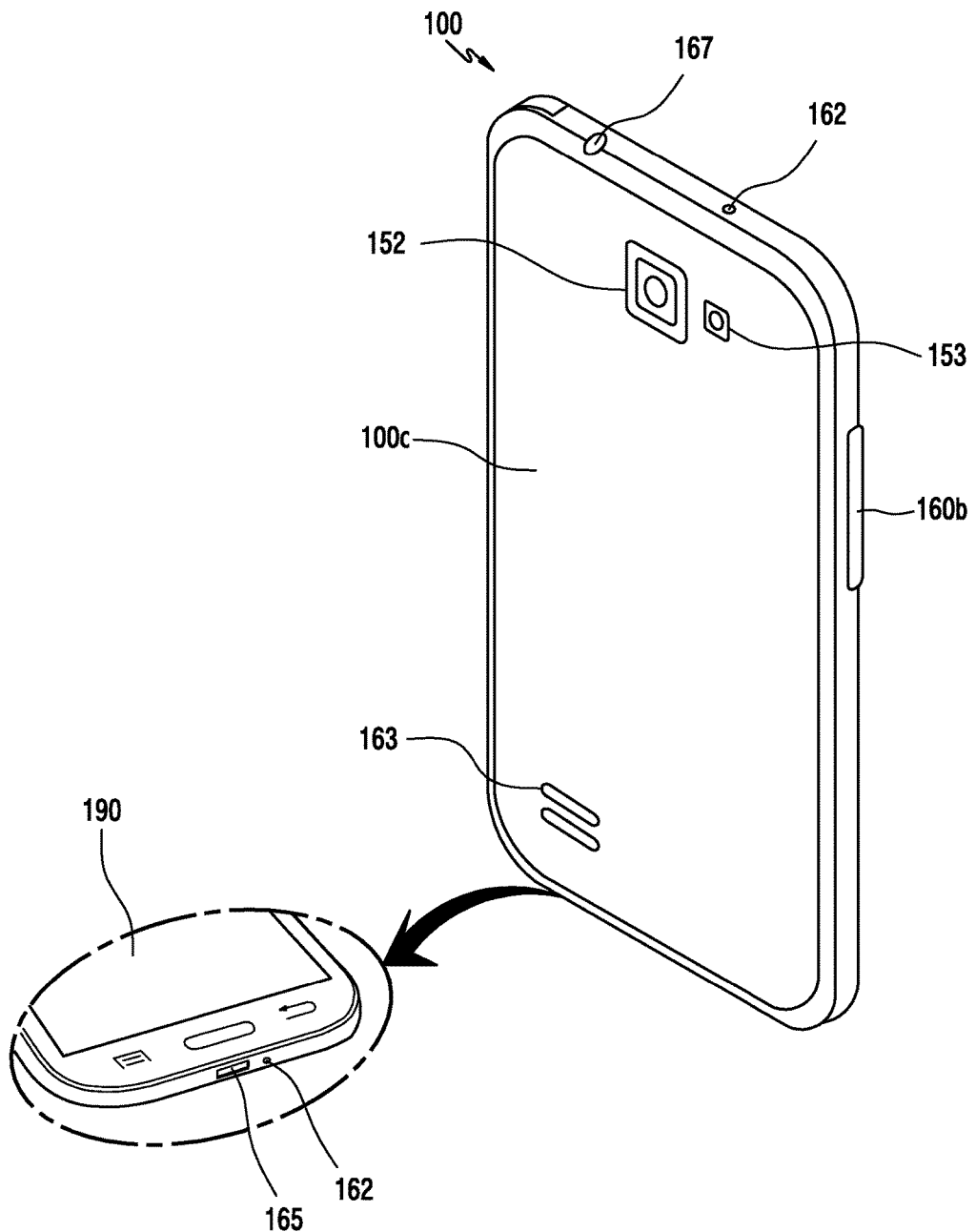
FIG. 4 illustrates a rear side of an electronic device, according to an embodiment of the present disclosure.

FIG. 4 illustrates a rear side of an electronic device, according to an embodiment of the present disclosure.

Referring to FIGS. 3 and 4, a touch screen 190 is disposed in the center of the front side 100a of the electronic device 100. The touch screen 190 covers a majority of the front side 100a of the electronic device 100.

FIG. 3 illustrates an example in which a main home screen is displayed on the touch screen 190. The main home screen is the first screen displayed on the touch screen 190 when the electronic device 100 is turned on. Further, when the electronic device 100 has different home screens of several pages, the main home screen may be the first home screen among the several pages of home screens.

Shortcut icons 191-1, 191-2, and 191-4 for executing frequently used applications, a main menu switching key 191-4, time, weather, and a search bar are displayed on the home screen. The main menu switching key 191-4 is used to display a menu screen on the touch screen 190.

On the upper side of the touch screen 190, a status bar 192 may be formed that indicates a status of the electronic device 100 such as a battery charging status, the strength of a received signal, and the current time.

A home button 161a, a menu button 161b, and a back button 161c may be formed on the lower side of the touch screen 190. The home button 161a is used to display the main home screen on the touch screen 190. For example, when the home button 161a while a home screen different from the main home screen or the menu screen is displayed on the touch screen 190, the main home screen is displayed on the touch screen 190. Further, when the home button 161a is touched while applications are executed on the touch screen 190, the main home screen, as illustrated in FIG. 3, may be displayed on the touch screen 190. In addition, the home button 161a may be used to display recently used applications or a task manager on the touch screen 190.

The menu button 161b provides a connectivity menu that may be used on the touch screen 190. The connectivity menu may include a widget addition menu, a background switching menu, a search menu, an editing menu, an environment setting menu, etc.

The back button 161c may be used to display the screen, which was executed just before the currently executed screen, or to complete the most recently used application.

A first camera 151, an illumination sensor 170a, and a proximity sensor 170b are disposed at an edge of the front side 100a of the electronic device 100.

A second camera 152, a flash 153, and a speaker 163 may be disposed on the rear side 100c of the electronic device 100.

For example, a power/reset button 160a, a volume button 161b, a terrestrial DMB antenna 141a for receiving a broadcast, and one or more microphones 162 may be disposed on the lateral side 100b of the electronic device 100. The DMB antenna 141a may be fixed to, or detachably coupled to, the electronic device 100.

Further, a connector 165 is formed on the bottom side of the electronic device 100. The connector 165 may have a plurality of electrodes formed therein, and may be connected to an external device in a wired manner.

An earphone connecting jack 167 may be disposed on the top side of the electronic device 100. The plug of earphones may be inserted into the earphone connecting jack 167. The earphone connecting jack 167 may be disposed on the bottom side of the electronic device 100.

FIGS. 5A to 5H are diagrams sequentially illustrating a conventional process of manufacturing a printed circuit board assembly.

Figure 5A:
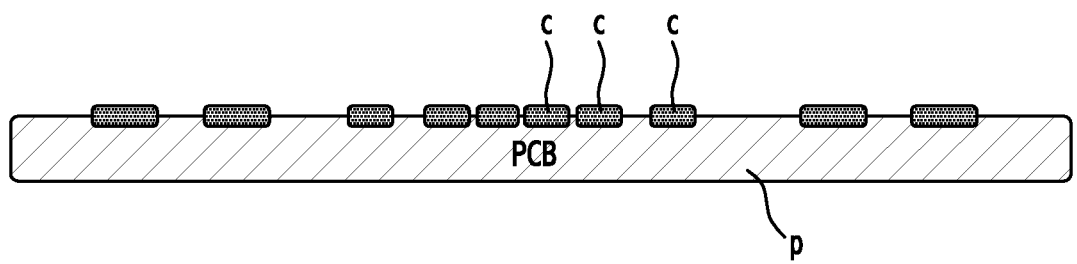
FIGS. 5A to 5H are diagrams sequentially illustrating a conventional process of manufacturing a printed circuit board assembly.

Referring to FIG. 5A, a substrate P (e.g., a PCB) is prepared. A plurality of bonding pads C for circuit connection are applied to the prepared substrate P. For reference, a substrate on which a plurality of electronic components are mounted in a surface mounting device (SMD) scheme may be referred to as a "substrate assembly (PBA assembly)."

Figure 5B:
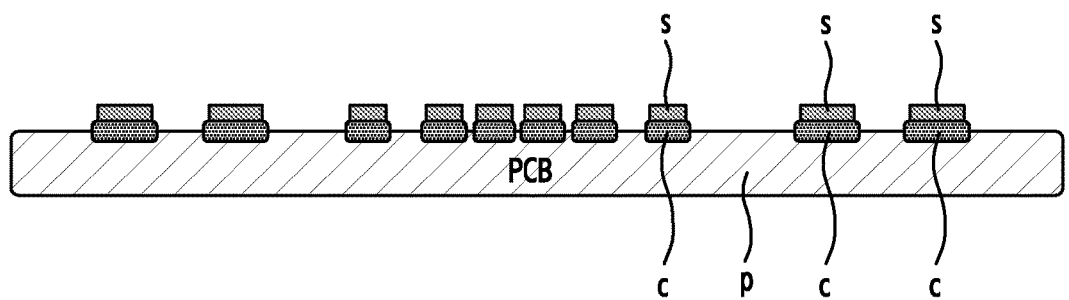

Referring to FIG. 5B, solder S is applied to the plurality of bonding pads C of the prepared substrate P.

Figure 5C:
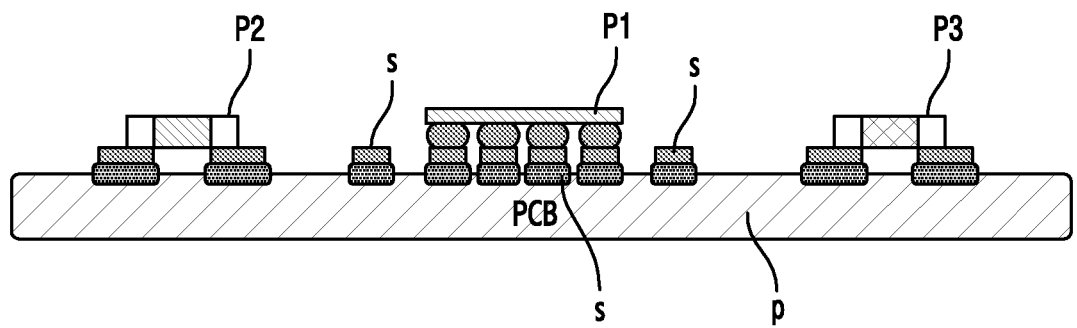

Referring to FIG. 5C, a plurality of electronic components P1, P2, and P3, e.g., a passive component, an active component, and an IC component, are mounted on the solder S. The mounted electronic components may include the component P1, which radiates a large amount of heat, or the components P2 and P3 radiating smaller amounts of heat. In addition, the mounted components may include a component emitting a large amount of electromagnetic waves, or a component causing noise interference according to the emission of electromagnetic waves.

Figure 5D:
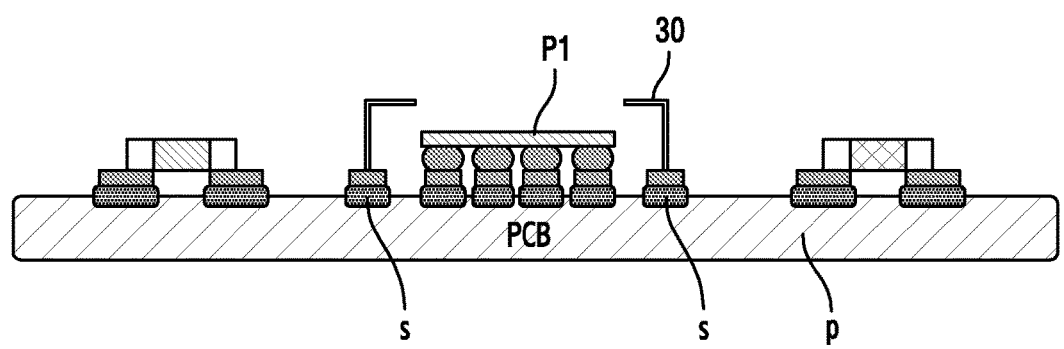

Referring to FIG. 5D, after the electronic components P1 to P3 are mounted on the substrate P, a shield unit frame 30 is mounted on the component P1, which radiates a large amount of heat, among the electronic components. At least part of the shield unit frame 30 may be disposed on the solder S, such that the shield unit frame 30 is supported on the substrate P in an upright state. At least part or the entirety of the upper surface of the shield unit frame 30 may be configured to be open.

Figure 5E:
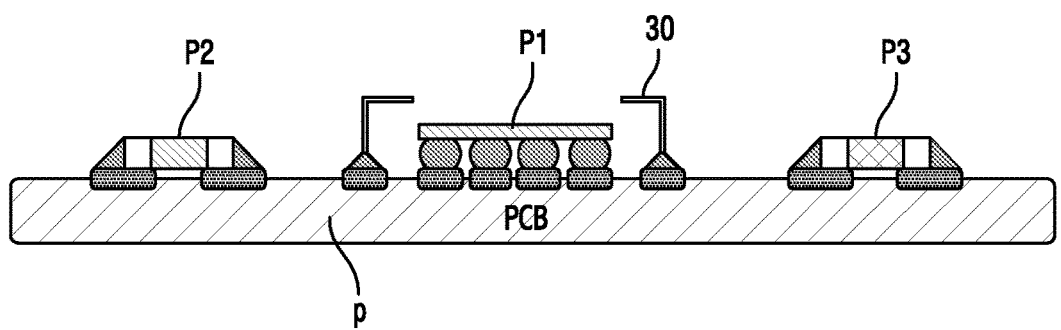

Referring to FIG. 5E, after the plurality of electronic components P1 to P3 are mounted on the substrate P, the electronic components P1 to P3 may be bonded to the substrate P through reflow soldering.

Figure 5F:
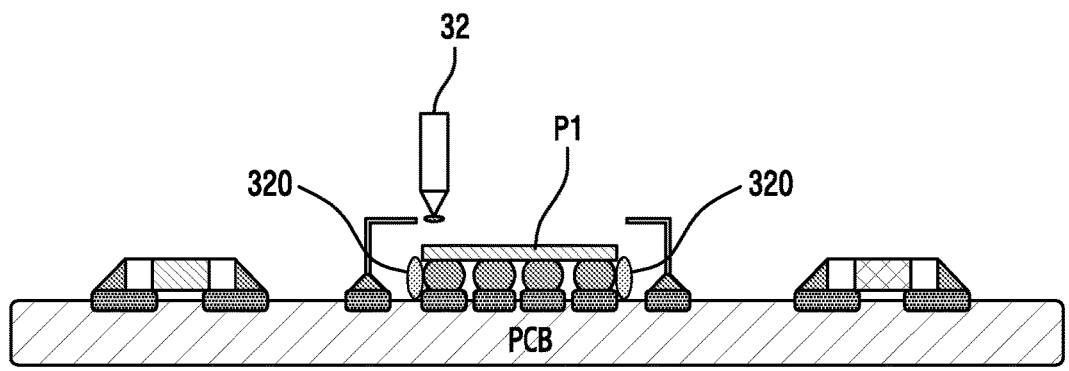

Referring to FIG. 5F, after the electronic components P1 to P3 are bonded to the substrate P, an under-fill resin material 320 may be applied around the electronic component P1, which radiates a large amount of heat, using an under-fill material applying device 32. The under-fill resin material may be applied to surround at least part or the entirety of the periphery of the electronic component.

Figure 5G:
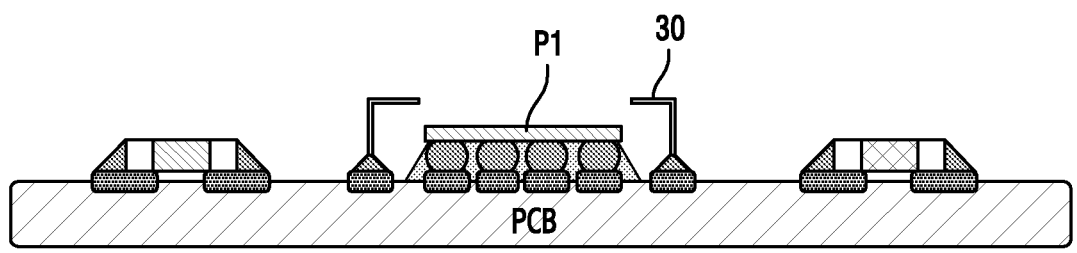

Referring to FIG. 5G, after the under-fill resin material 320 is applied along the periphery of the electronic component P1, the applied under-fill resin material 320 may be cured at a first temperature in a first time.

Figure 5H:
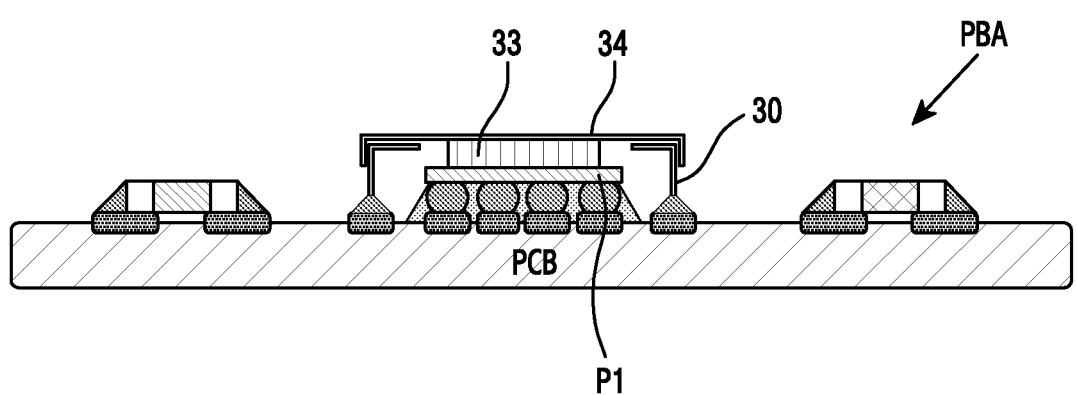

Referring to FIG. 5H, after the under-fill resin material 320 around the electronic component P1 is cured, a shield unit cover 34 to which a heat dissipation pad 33 is attached is fastened to the shield unit frame 30, and the manufacturing process for the substrate assembly (PBA) is completed.

In the above-described manufacturing method for the substrate assembly illustrated in FIGS. 5A to 5H, when the radiant-heat pad 33 is to be disposed below the shield unit cover 34, the radiant-heat pad 33 has to be positioned close to the electronic component P1 and the shield unit cover 34 in order to stably transfer heat. Accordingly, after the shield unit frame 30 is mounted in the component mounting step, the shield unit cover 34, to which the radiant-heat pad 33 is attached, is then manually fastened to the shield unit frame 30 by applying a certain pressure thereto in the last process step.

However, the shield unit mounting technology described above has a limit on productivity enhancement due to the manual fastening of the shield unit cover 34, and has a problem in terms of product reliability because the compressive stress of the radiant-heat pad 33 between the electronic component P1 and the shield unit cover 34 is also applied to the whole substrate.

Recently, the post-fastening process for the shield unit cover has been removed, and the shield unit frame and the shield unit cover that are integrally fastened to each other are often mounted at one time in order to enhance productivity.

FIGS. 6A to 6D are diagrams sequentially illustrating a process of manufacturing a printed circuit board assembly according to an embodiment of the present disclosure.

Figure 6A:
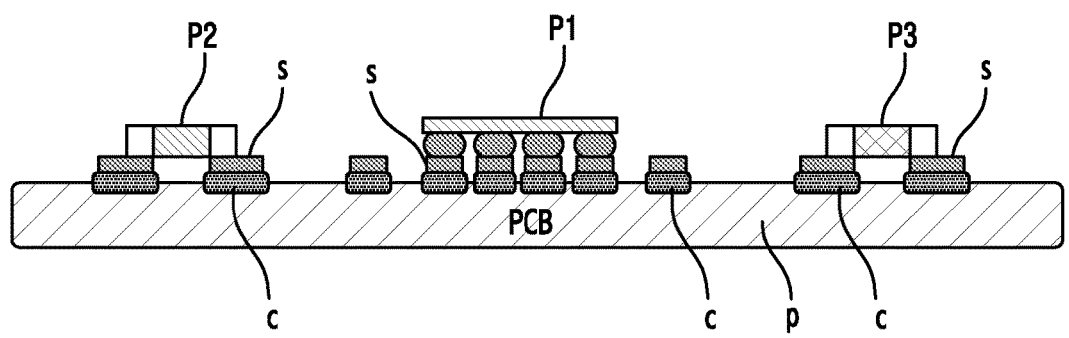
FIGS. 6A to 6D are diagrams sequentially illustrating a process of manufacturing a printed circuit board assembly according to an embodiment of the present disclosure.

Referring to FIG. 6A, a plurality of bonding pads C are applied to a prepared substrate P, and solder S is applied to the bonding pads C (similar to FIGS. 5A and 5B described above). For example, the bonding pads C may be circuits for electrically connecting electronic components.

Normally, an electronic device has at least one printed circuit board P embedded therein, and a plurality of chips or electronic components for supporting various functions may be mounted on the printed circuit board P. The plurality of electronic components may be mounted on the upper or lower surface of the printed circuit board P, and the side surfaces of the printed circuit board P may also be used as a component mounting space or a component wiring space. Surface-mounted components may be mounted on the upper and/or lower surface of the printed circuit board P by using an SMD. The printed circuit board P may be formed of a hard or soft material. Further, the printed circuit board P may be mounted in the electronic device in a joint structure in which several hard substrates are connected by a soft substrate.

A plurality of electronic components P1, P2, and P3, for example, a passive component, an active component, and an IC component may be mounted on the substrate P to which the solder S is applied. The mounted electronic components may include the component P1, which radiates a large amount of heat, or the components P2 and P3 which radiate a small amount of heat. In addition, the mounted components P1 to P3 may include a component emitting a large amount of electromagnetic waves, or a component causing noise interference according to the emission of electromagnetic waves.

Particularly, the mounted electronic component P1 may be an electronic component associated with an RF unit, power, or a processor. The associated components may be mounted on the substrate P in an encapsulated type by using a shield unit, which will be described below. The shield unit shields the mounted component P1 from an electrical interference signal and a signal radiated into a space thereof.

Figure 6B:
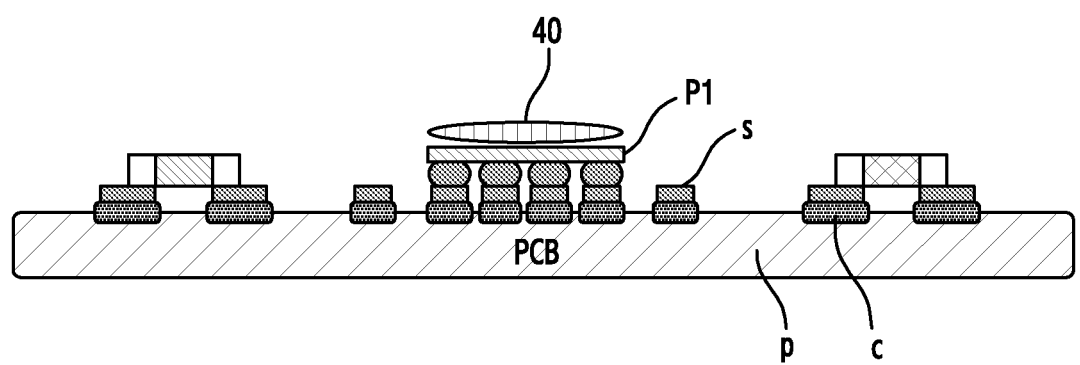

Referring to FIG. 6B, after the electronic components P1 to P3 are mounted on the substrate P, a radiant-heat material 40 is supplied on the electronic component P1 which radiates a large amount of heat. The radiant-heat material 40 may be a liquefied radiant-heat material.

Figure 6C:
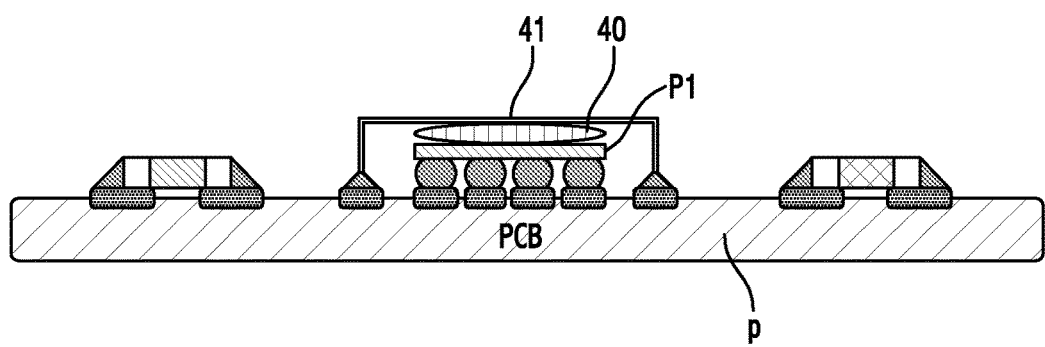

Referring to FIG. 6C, after the liquefied radiant-heat material 40 is supplied on the component P1, which radiates a large amount of heat, among the electronic components mounted on the substrate P, a shield unit 41 is mounted on the liquefied radiant-heat material 40. At least part of the lower end of the shield unit 41 may be supported on the solders S in an upright state. The liquefied radiant-heat material 40 may be disposed between the upper surface of the electronic component P1, which radiates a large amount of heat, and the shield unit 41.

Figure 6D:
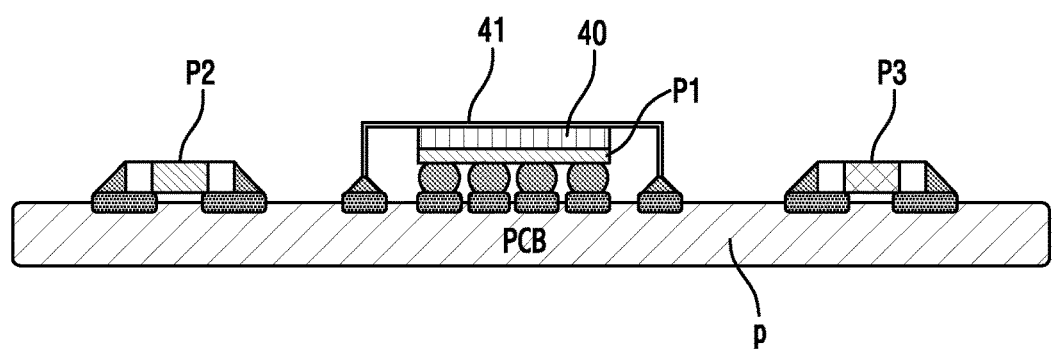

Referring to FIG. 6D, after the plurality of electronic components P1 to P3 are mounted on the substrate P, the electronic components P1 to P3 may be bonded to the substrate P through heating (i.e., reflow soldering). At the same time, the liquefied radiant-heat material 40 may be cured, and the manufacturing process for the substrate assembly may be completed. The curing of the liquefied radiant-heat material 40 and the bonding of the shield unit may be simultaneously performed. In this case, the liquefied radiant-heat material 40 may be completely cured at a process temperature for bonding the electronic components and the shield unit.

Among the electronic components P1 to P3 mounted on the substrate, the electronic component P1 radiates the largest amount of heat, and therefore, a description will be given under the assumption that the electronic component P1 is a heating component. The heating component P1 is a component that radiates the largest amount of heat while operating, and may include, for example, a power amplifier (PA) or a PAM of an RF unit, or a component such as an AP. It should be noted that a heat dissipation device, according to various embodiments of the present disclosure, may be identically applied to a heating component which radiates heat of a relatively high temperature.

A heat dissipation device for the electronic component P1, according to various embodiments of the present disclosure, may include a substrate P on which at least one heating component P1 is mounted, a shield unit 41, and a radiant-heat material 40. The substrate P is a board on which a plurality of components P1 to P3 are mounted using a SMD scheme, and a plurality of components may be mounted on opposite surfaces of the substrate P.

The shield unit 41 is a heat conductive member of a soft material that absorbs the heat of the heating component P1 through the radiant-heat material, or transfers the heat to a different structure of a relatively low temperature, and may be formed of metal having excellent thermal conductivity. The shield unit 41 may be disposed on the substrate P1 to surround the heating component P1. The liquefied radiant-heat material 40 may be disposed between the heating component P1 and the shield unit 41 in order to transfer the heat transmitted from the heating component P1 to the shield unit 41. The liquefied radiant-heat material 40, which is a soft material, may be made of a resilient thermal interface material (TIM), and may be disposed close to the heating component P1 and the shield unit 41.

In addition, the liquefied radiant-heat material 40 may include a material that experiences a phase change caused by heat or a thermosetting resin. According to the aforementioned structure, the heat generated from the heating component P1 may be transferred to the shield unit 41 via the liquefied radiant-heat material 40. The shield unit 41 may be a low-temperature area, compared to the heating component P1.

FIGS. 7A to 7G are diagrams sequentially illustrating a process of manufacturing a printed circuit board assembly according to an embodiment of the present disclosure.

Figure 7A:
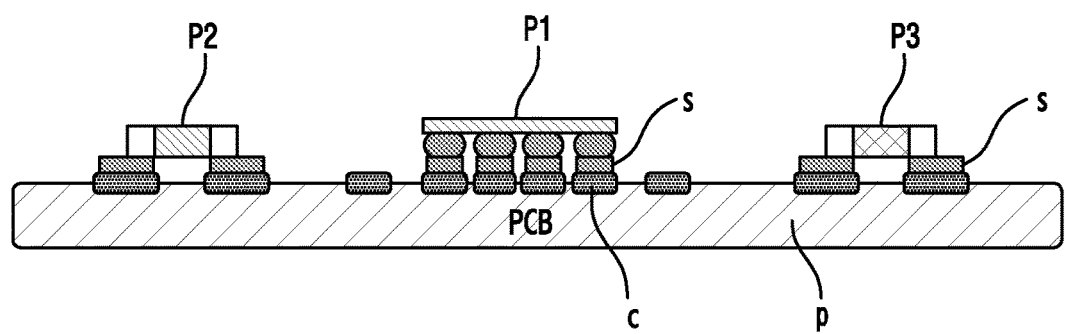
FIGS. 7A to 7G are diagrams sequentially illustrating a process of manufacturing a printed circuit board assembly according to an embodiment of the present disclosure.

Referring to FIG. 7A, bonding pads C are applied to a substrate P, and solder S is applied to the bonding pads C (similar to FIGS. 5A and 5B as described above). The process of applying the solder may be performed at a first temperature, e.g., between 230° C. and 250° C. Further, it is possible to not apply solder to a bonding pad on which a shield unit is mounted, which will be described below.

Figure 7B:
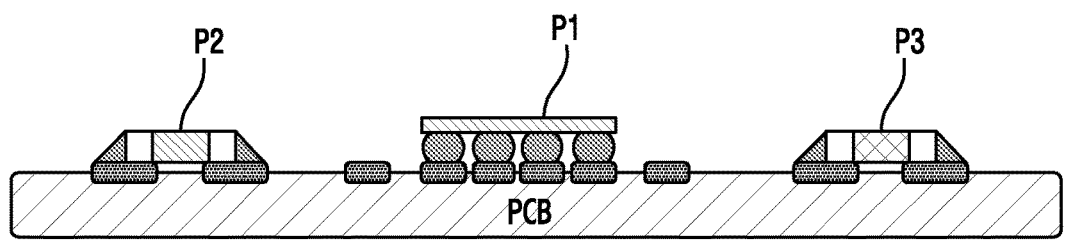

Referring to FIG. 7B, after a plurality of electronic components P1 to P3 are mounted on the substrate P, the electronic components P1 to P3 may be bonded to the solder S through heating (i.e., reflow soldering). The plurality of electronic components P1 to P3, for example, a passive component, an active component, and an IC component, may be mounted on the substrate P to which the solder S is applied. The mounted electronic components may include the component P1 radiating a large amount of heat, or the components P2 and P3 radiating smaller amounts of heat.

In addition, the mounted components P1 to P3 may include a component emitting a large amount of electromagnetic waves, or a component causing noise interference according to the emission of electromagnetic waves.

Particularly, the mounted electronic component P1 may be an electronic component associated with an RF unit, a power supply, or a processor. The associated components may be mounted on the substrate P in an encapsulated type by using the shield unit, which will be described below. The shield unit shields the mounted component P1 from an electrical interference signal and a signal radiated into a space thereof.

Figure 7C:
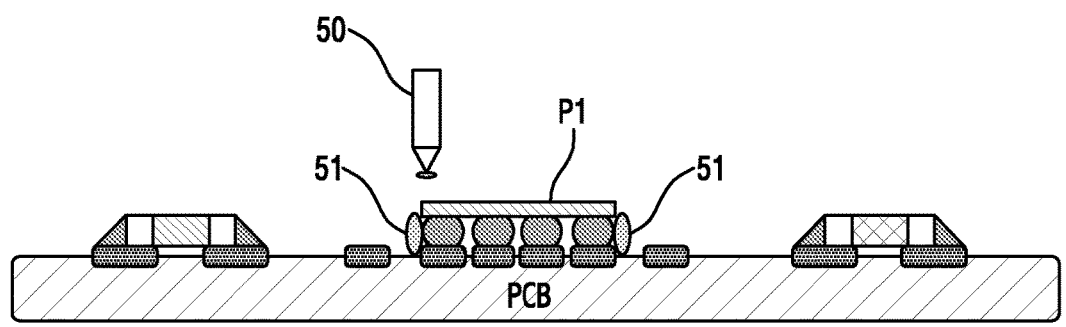

Referring to FIG. 7C, after the electronic components P1 to P3 are bonded to the substrate P, an under-fill resin material 51 is applied around the electronic component P1, which radiates a large amount of heat, using an under-fill material applying device 50. The under-fill resin material 51 may reinforce the strength of the electronic component P1.

Figure 7D:
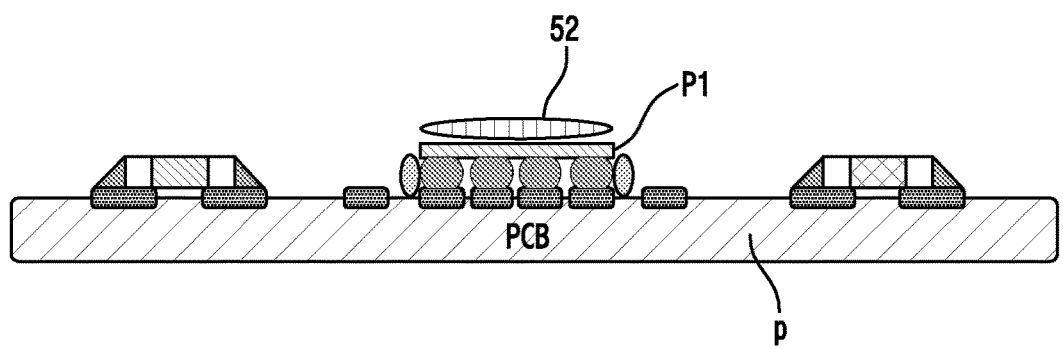

Referring to FIG. 7D, after the electronic components P1 to P3 are mounted on the substrate P, a liquefied radiant-heat material 52 is supplied on the electronic component P1, which radiates a large amount of heat. The liquid heat-dissipation material may be supplied through one of dispensing, jetting, and printing.

Figure 7E:
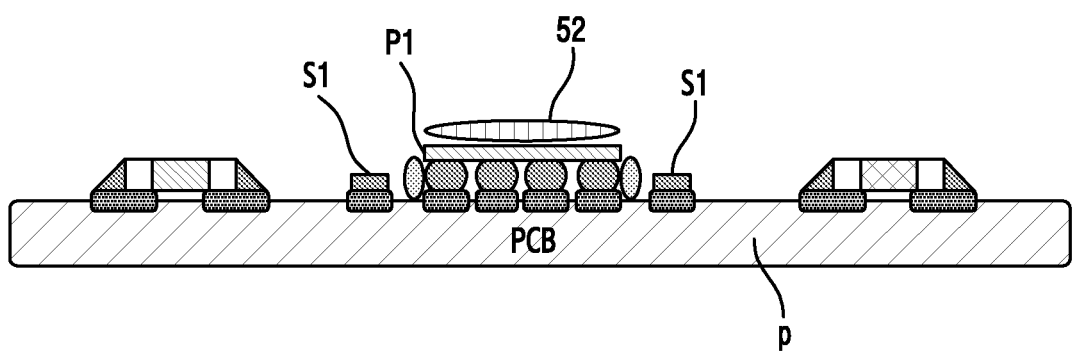

Referring to FIG. 7E, solder S1 may be applied to shield unit bonding pads, which are applied to the substrate P, at a second temperature, e.g., between 120° C. and 200° C.

Figure 7F:
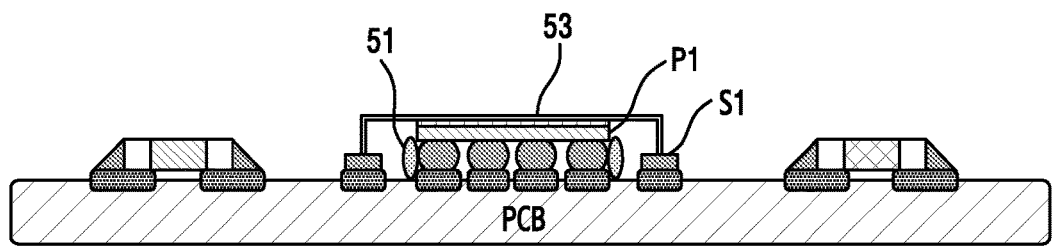

Referring to FIG. 7F, after the liquefied radiant-heat material 52 is supplied on the component P1, a shield unit 53 is mounted on the solders S1 of the substrate P and on the liquefied radiant-heat material 52. At least part of the lower end of the shield unit 53 may be supported on the applied solder S1 in an upright state. The liquefied radiant-heat material 52 is disposed between the upper surface of the electronic component P1, which radiates a large amount of heat, and the shield unit 53.

Figure 7G:
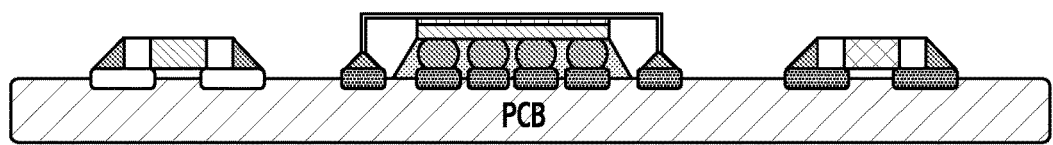

Referring to FIG. 7G, after the plurality of electronic components P1 to P3 are mounted on the substrate P, curing the under-fill resin material 51 and bonding the liquefied radiant-heat material 52 and the shield unit may be simultaneously performed through a curing process, thereby completing the manufacturing process for the substrate assembly.

The liquefied radiant-heat material 52 may be completely cured at the reflow soldering process temperature at which the electronic component P1 located on the substrate P is bonded, at the under-fill curing process temperature, and at the temperature for the shield unit bonding process performed after the electronic component bonding process.

In addition, the liquefied radiant-heat material 52 may be primarily surface-hardened at the reflow soldering process temperature at which the electronic component on the substrate P is bonded, at the under-fill curing process temperature, and at the temperature for the shield unit bonding process performed after the electronic component bonding process, and then the interior of the liquefied radiant-heat material 52 may be completely cured during the following process.

Further, the liquefied radiant-heat material 52 may be made of a material that has a predetermined viscosity in order to prevent a failure in the bonding between the electronic component P1 and the shield unit 53, while sufficiently filling the gap between the electronic component P1 located on the substrate P and the shield unit 53.

In addition, the liquefied radiant-heat material 52 may be configured of a material having a proper shape maintenance characteristic in order to sufficiently fill the gap between the electronic component P1 and the shield unit 53, after being supplied on the electronic component P1 located on the substrate P.

Additionally, the liquefied radiant-heat material 52 may be supplied on the entire upper surfaces of the plurality of electronic components, or may be supplied to completely fill the interior of the shield unit 53.

The liquefied radiant-heat material 52 used herein is a liquid type material with a predetermined range of viscosity that can freely change in shape depending on a filling location and shape, and may be cured in a solid form in the reflow soldering process or the under-fill curing process. Consequently, the above-described processes for manufacturing the substrate assembly have features such that the mounting of the liquefied radiant-heat material and the shield unit is performed together with the applying and curing the under-fill resin. In this case, because the shield unit 53 is mounted after the under-fill resin is applied, it is possible to solve a problem in the related art that there is a limit on the direction and location where an under-fill resin is applied due to the shape and location of a shield unit frame.

As described above, in a method of manufacturing a substrate assembly according to an embodiment of the present disclosure, the liquid heat-dissipation material is supplied on a component requiring radiant-heat before or after reflow soldering, and the shield unit is automatically mounted on the liquefied radiant-heat material without a separate compression process. Thereafter, through the reflow soldering and under-fill curing process, the liquefied radiant-heat material is cured at the same time that the component and the shield unit are bonded, thereby achieving manufacturing efficiency.

Accordingly, the liquefied radiant-heat material applied to the present disclosure may be cured at a temperature of about 130° C. to 200° C., such that the curing may be performed at the process temperature for reflow soldering and under-fill curing. In addition, the liquefied radiant-heat material may have a predetermined viscosity and a shape maintenance characteristic in order to prevent a failure in bonding between a component and a shield unit, while sufficiently filling the gap between the component and the shield unit.

Referring again to FIG. 7D, the liquefied radiant-heat material 52 may include a thermal interface material (TIM). The TIM may or may not have an electric conductivity. For example, when the TIM has electric conductivity, the TIM may shield electrical noise or electro-magnetic interference (EMI). Alternatively, the TIM may also have excellent wear resistance or heat resistance. For example, the TIM may include a thermoplastic material.

The TIM may also include a phase change material (PCM). The PCM may be changed from the solid phase into the liquid phase by heat. Here, a liquid PCM may have a viscosity.

Alternatively, the liquid phase change material may be compressible or incompressible.

The TIM may also include a material of which at least one physical property is changed by heat. For example, the TIM may have a high viscosity caused by heat.

Additionally, the TIM may include a double-sided tape (not illustrated) that may have a thermal conductivity.

Figure 8:
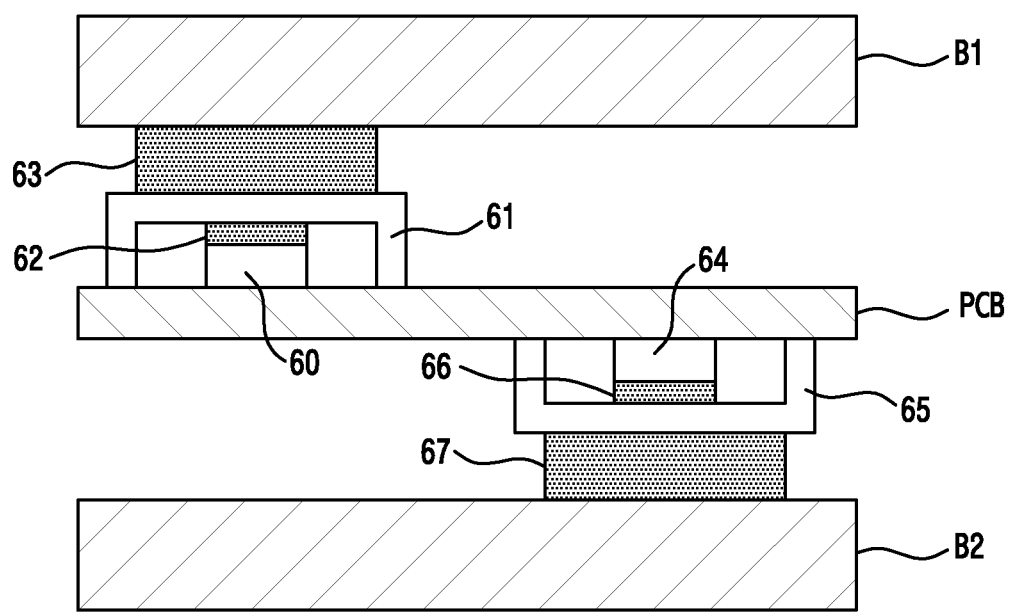
FIG. 8 illustrates a sectional view of an additional radiant-heat structure for a printed circuit board assembly, according to an embodiment of the present disclosure.
Figure 9:
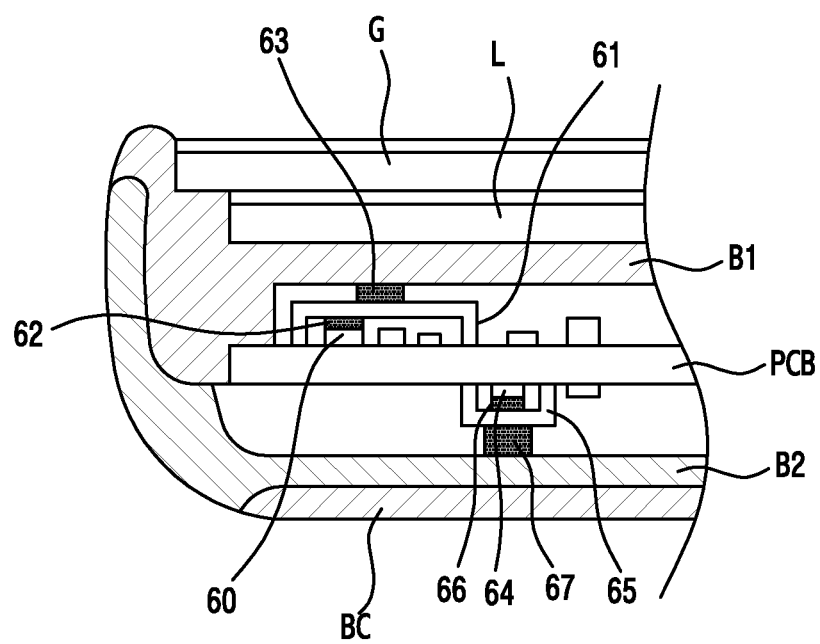
FIG. 9 illustrates a fragmentary sectional view of an electronic device including an additional liquefied radiant-heat structure for a printed circuit board assembly, according to an embodiment of the present disclosure.

FIG. 8 illustrates a sectional view of an additional radiant-heat structure for a printed circuit board assembly, according to an embodiment of the present disclosure, and FIG. 9 illustrates a fragmentary sectional view of an electronic device including an additional liquefied radiant-heat structure for a printed circuit board assembly, according to an embodiment of the present disclosure. Specifically, FIGS. 8 and 9 illustrate a radiant-heat structure in which additional radiant-heat materials 63 and 67 are applied to first and second heating components 60 and 64, respectively. The first and second heating components 60 and 64 may transfer heat to shield units 61 and 65 through radiant-heat materials 62 and 66, respectively.

Referring to FIGS. 8 and 9, the substrate (PCB) has upper and lower surfaces on which a plurality of components may be mounted. In FIG. 8, the heating components 60 and 64 are mounted on the upper and lower surface of the substrate, respectively.

Further, the substrate (PCB), which is mounted in a main body of the electronic device, may be disposed to face an inner bracket B1 above the substrate and a rear case B2 below the substrate. Accordingly, the first radiant-heat unit may be the inner bracket B1, and the second radiant-heat unit may be the rear case B2. Accordingly, the respective heating components 60 and 64, which are mounted on the upper and lower surfaces of the substrate (PCB), may be configured to dissipate heat using the inner bracket B1 and the rear case B2 as radiant-heat units. That is, radiant-heat structures may be added to the first and second heating components 60 and 64, by applying the additional radiant-heat materials 63 and 67.

The heat radiated from the first heating component 60 may be primarily transferred to the shield unit 61 through the radiant-heat material 62, and then may be transferred to the inner bracket B1 though the additional radiant-heat material

63. The inner bracket B1 may be a lower temperature area, compared to the shield unit 61.

Further, the heat radiated from the second heating component 64 may be primarily transferred to the shield unit 65 through the radiant-heat material 66, and then may be transferred to the rear case B2 though the additional radiant-heat material 67. The rear case B2 may be a lower temperature area, compared to the shield unit 65.

The radiant-heat materials 62 and 66, which are disposed on the first and second heating components 60 and 64, may be configured in a liquid phase, and the additional radiant-heat materials 63 and 67, which are disposed on the shield units 61 and 65, may be configured in a liquid or solid phase.

Referring to FIG. 9, reference G refers to a glass substrate, and reference BC refers to a battery cover or a rear cover. The rear case B2 is coupled to the battery cover BC such that the battery cover BC may assist with the radiant-heat of the rear case.

In the various embodiments of the present disclosure as described above, a conventional solid radiant-heat material is replaced by a liquefied radiant-heat material that has a higher degree of freedom of shape and an excellent adhesion force at an interface so that filling a radiant-heat material can be performed while mounting components and shield units. Therefore, the process of manually fastening a shield unit cover, which is required in the conventional art in order to position a solid radiant-heat material close to a component and a shield unit, is removed, thereby enhancing productivity and preventing internal stress caused by the compressed radiant-heat material being applied to a substrate.

Further, in the various embodiments of the present disclosure as described above, a liquefied radiant-heat material can be stably brought close to the fine surfaces of a component and a shield unit, thereby ensuring a radiant-heat capability. For example, substantially, there may be not a gap between the liquefied radiant-heat material and the fine surfaces of the component and the shield unit. Because a surface, in association with a heat transfer between the liquefied radiant-heat material and the fine surfaces of the component and the shield unit, is increased, the radiant-heat capability may be improved.

In the various embodiments of the present disclosure as described above, the mounting of a shield unit and the supplying and filling of a radiant-heat material can be simultaneously performed, thereby making it is possible to use a cover type of shield unit with only a shield unit cover, rather than a shield unit frame. This operation reduces the cost of the shield unit, and makes it possible to decrease the height of a PCB on which components are mounted, thereby slimming an electronic product.

According to the various embodiments of the present disclosure as described above, in the use of a frame type of shield unit and a cover type of shield unit, the under-fill process, the radiant-heat filling process, and the shield unit mounting process can be performed en bloc on a component to which an under-fill resin is to be applied. Therefore, it is possible to solve the problem in the conventional art that the direction and location where under-fill resin may be applied are restricted due to the shape and location of a shield unit frame when the under-fill resin is supplied after the shield unit frame is mounted. It is also possible to solve the design and process limits that a shield unit cover has to include a cutaway portion for supplying an under-fill resin when the under-fill resin is supplied after the shield unit cover is fastened. Basically, the degree of freedom of process and design can be significantly enhanced.

It will be appreciated that the above-described embodiments of the present invention according to the claims and description in the specification can be realized in the form of hardware, software or a combination of hardware and software.

Any such software may be stored in a computer readable storage medium. The computer readable storage medium stores one or more programs (software modules), the one or more programs comprising instructions, which when executed by one or more processors in an electronic device, cause the electronic device to perform a method of the present invention.

Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape or the like. It will be appreciated that the storage devices and storage media are embodiments of machine-readable storage that are suitable for storing a program or programs comprising instructions that, when executed, implement embodiments of the present invention.

Accordingly, embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

While the present disclosure has been particularly shown and described with reference to certain embodiments thereof, it will be understood by those of ordinary skill in the art that various changes in form and details may be made therein without departing from the spirit and scope of the present disclosure as defined by the following claims and their equivalents.

What is claimed is:

1. A method of manufacturing a printed circuit board assembly, the method comprising:
    applying solder to a plurality of bonding pads provided on the printed circuit board;
    mounting an electronic component on the applied solder;
    applying a liquefied radiant-heat material on the electronic component;
    mounting a shield unit on at least one of the bonding pads, the shield unit contacting the liquefied radiant-heat material; and
    applying heat at a temperature that simultaneously bonds the electronic component and the shield unit and cures the liquefied radiant-heat material.

2. The method of claim 1, wherein the electronic component includes at least one of a power amplifier (PA), a power amplifier module (PAM), a power management integrated circuit (PMIC), and a processor.

3. A method of manufacturing a printed circuit board assembly, the method comprising:
    applying solder, at a first temperature, to a plurality of bonding pads provided on the printed circuit board;
    mounting an electronic component on the applied solder;
    bonding the electronic component to the printed circuit board through heating;
    applying an under-fill resin material for reinforcing a strength of the electronic component;

applying a liquefied radiant-heat material on the electronic component;

mounting a shield unit on the shield unit bonding pad, the shield unit contacting the liquefied radiant-heat material; and applying heat at a temperature that simultaneously cures the under-fill resin material and the liquefied radiant-heat material and bonds the shield unit and the electronic component.

4. The method of claim 3, wherein no solder is applied to a bonding pad on which the shield unit is mounted.

5. The method of claim 3, wherein the shield unit is mounted after solder is applied, at a second temperature, to a bonding pad for the shield unit.

6. The method of claim 5, wherein the first temperature is in a range of 230° C. to 250° C., and the second temperature is in a range of 120° C. to 200° C.

7. The method of claim 3, wherein the liquefied radiant-heat material is cured at at least one of a reflow soldering process temperature at which the electronic component is bonded, an under-fill curing process temperature, and a temperature for a shield unit bonding process performed after an electronic component bonding process.

8. The method of claim 3, wherein the liquefied radiant-heat material is primarily surface-hardened at at least one of a reflow soldering process temperature at which the electronic component is bonded, an under-fill curing process temperature, and a temperature for a shield unit bonding process performed after an electronic component bonding process, and wherein an interior of the liquefied radiant-heat material is cured after the liquefied radiant-heat material is primarily surface-hardened.

9. The method of claim 3, wherein the liquefied radiant-heat material has a predetermined viscosity to prevent a failure in bonding between the electronic component and the shield unit, while sufficiently filling a gap between the electronic component and the shield unit.

10. The method of claim 3, wherein the liquefied radiant-heat material has a proper shape maintenance characteristic to sufficiently fill a gap between the electronic component and the shield unit.

11. The method of claim 3, wherein the liquefied radiant-heat material completely fills an interior of the shield unit.

12. The method of claim 3, wherein the liquefied radiant-heat material is applied through one of dispensing, jetting, and printing.

13. The method of claim 3, further comprising applying an additional liquefied radiant-heat material on the shield unit for additional heat transfer to a different structure at a relatively low-temperature area, compared to the shield unit.

14. The method of claim 13, wherein the additional liquefied radiant-heat material comprises a solid radiant-heat pad or a liquefied radiant-heat material.

15. The method of claim 14, wherein the different structure comprises an inner bracket or a rear case.

* * * * *